United States Patent
Wu et al.

(10) Patent No.: US 8,846,160 B2
(45) Date of Patent: Sep. 30, 2014

(54) THREE-DIMENSIONAL ARTICLES USING NONLINEAR THERMAL POLYMERIZATION

(75) Inventors: Pingfan Wu, Woodbury, MN (US); Ying-Yuh Lu, Woodbury, MN (US); Robin E. Wright, Inver Grove Heights, MN (US); Robert J. DeVoe, Arden Hills, MN (US); Travis L. Potts, Woodbury, MN (US); Douglas S. Dunn, Maplewood, MN (US); Wayne S. Mahoney, St. Paul, MN (US); Dong-Wei Zhu, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 141 days.

(21) Appl. No.: 13/131,418

(22) PCT Filed: Nov. 11, 2009

(86) PCT No.: PCT/US2009/063954
§ 371 (c)(1),
(2), (4) Date: Jul. 20, 2011

(87) PCT Pub. No.: WO2010/065247
PCT Pub. Date: Jun. 10, 2010

(65) Prior Publication Data
US 2011/0269865 A1    Nov. 3, 2011

Related U.S. Application Data

(60) Provisional application No. 61/120,068, filed on Dec. 5, 2008.

(51) Int. Cl.
C08F 2/46 (2006.01)
C08F 2/50 (2006.01)
B05D 3/06 (2006.01)
G03F 7/029 (2006.01)
G03F 7/031 (2006.01)
G03F 7/00 (2006.01)

(52) U.S. Cl.
CPC ............ *G03F 7/029* (2013.01); *G03F 7/031* (2013.01); *G03F 7/0037* (2013.01)
USPC ........... 427/521; 427/508; 427/510; 427/517; 522/2; 522/60; 522/65; 522/67; 522/182; 522/178; 428/69; 428/68; 428/313.3

(58) Field of Classification Search
USPC ........... 428/69, 68, 313.3; 427/508, 510, 521, 427/517; 522/2, 60, 65, 67, 182, 178
See application file for complete search history.

(56) References Cited

U.S. PATENT DOCUMENTS 3,018,262 A    1/1962    Schroeder
3,117,099 A    1/1964    Proops et al.
(Continued)

FOREIGN PATENT DOCUMENTS

EP    1 403 041 A2    3/2004
EP    1 621 340 A2    2/2006
(Continued)

OTHER PUBLICATIONS

Bartolo et al., Stereolithographic Processes: Materials, Techniques and Applications, *10$^{emes}$ Assises Européennes de Protoypage Rapide*, Sep. 14 & 15, 2004, 13 pgs.

(Continued)

*Primary Examiner* — Sanza McClendon
(74) *Attorney, Agent, or Firm* — Bradford B. Wright; Stephen F. Wolf (57) ABSTRACT

A method for building three-dimensional articles using a thermal polymerization process in provided. The articles are built by using a composition that includes a thermally polymerizable composition, a thermal initiator, and a nonlinear light-to-heat conversion material such as a reverse saturable dye. The article is built by the sequential exposure of adjacent voxels with a laser beam. Microlens arrays can be used to expose more than one voxel at a time.

14 Claims, 2 Drawing Sheets

(56) References Cited

U.S. PATENT DOCUMENTS

| | | |
|---|---|---|
| 4,279,717 A | 7/1981 | Eckberg et al. |
| 4,642,126 A | 2/1987 | Zador et al. |
| 4,652,274 A | 3/1987 | Boettcher et al. |
| 5,066,722 A | 11/1991 | Nakano et al. |
| 5,070,161 A | 12/1991 | Nakano et al. |
| 5,235,015 A | 8/1993 | Ali et al. |
| 5,545,676 A | 8/1996 | Palazzotto et al. |
| 5,753,346 A | 5/1998 | Leir et al. |
| 5,851,674 A | 12/1998 | Pellerite et al. |
| 5,856,373 A | 1/1999 | Kaisaki et al. |
| 5,998,495 A | 12/1999 | Oxman et al. |
| 6,025,406 A | 2/2000 | Oxman et al. |
| 6,635,689 B1 | 10/2003 | Mahoney et al. |
| 6,696,157 B1 | 2/2004 | David et al. |
| 6,759,177 B2 * | 7/2004 | Shimada et al. ........... 430/270.1 |
| 6,824,882 B2 | 11/2004 | Boardman et al. |
| 6,906,156 B2 | 6/2005 | Mahoney et al. |
| 7,173,778 B2 | 2/2007 | Jing et al. |
| 8,411,120 B2 * | 4/2013 | Wu et al. ...................... 347/172 |
| 2003/0054288 A1 | 3/2003 | Shimada et al. |
| 2004/0067451 A1* | 4/2004 | DeVoe et al. ................ 430/322 |
| 2004/0170923 A1 | 9/2004 | Steinmann et al. |
| 2004/0204513 A1 | 10/2004 | Takizawa et al. |
| 2005/0048288 A1 | 3/2005 | Flynn et al. |
| 2011/0063392 A1* | 3/2011 | Wu et al. ...................... 347/172 |
| 2011/1251557 * | 5/2011 | Wu et al. ........................ 283/75 |

FOREIGN PATENT DOCUMENTS

| | | |
|---|---|---|
| JP | 2004-144869 A | 5/2004 |
| JP | 2006-030373 A | 2/2006 |
| JP | 2006-047374 A | 2/2006 |
| JP | 2006-278659 A | 10/2006 |
| JP | 2007-009018 A | 1/2007 |
| JP | 2007-160523 A | 6/2007 |
| JP | 31395516 U | 2/2008 |
| WO | WO 01/40874 A1 | 6/2001 |
| WO | WO 2004/108799 A1 | 12/2004 |

OTHER PUBLICATIONS

Bartolo et al., Stereo-Thermal-Lithography: A New Principle for Rapid Prototyping, *Rapid Prototyping Journal*, vol. 9, No. 3, (2003) pp. 150-156.

Handbook of Epoxy Resins, Lee and Neville, McGraw-Hill Book Co., New York, (1967).

S. Nakano and T. Endo, Thermal Cationic Curing With Benzylammonium Salts, *Progress in Organic Coatings*, 22, (1993), pp. 287-300.

Nakano et al., Cationic Polymerization of Glycidyl Phenyl Ether by Benzylammonium Salts, *Journal of Polymer Science: Part A: Polymer Chemistry*, vol. 33, (1995) pp. 505-512.

Van Stryland et al., Characterization of Nonlinear Optical Absorption and Refraction, *Prog. Crystal Growth and Charact.*, vol. 27, (1993), pp. 279-311.

Li et al., Dynamic and Steady State Behavior of Reverse Saturable Absorption in Metallophthalocyanine, *Physics Review A*, vol. 49, No. 2, (1994), pp. 1149-1157.

Lepkowicz et al., Femtosecond-To-Nanosecond Nonlinear Spectroscopy of Polymethine Molecules, *J. Opt. Soc. Am. B*, vol. 22, (2005), pp. 2664-2685.

U.S. Appl. No. 60/990,446, Brian J. Gates, Robert T. Krasa, Travis L. Potts, Serge Wetzels, Nov. 27, 2007.

International Search Report, PCT/US2009/063954, 4 pgs.

* cited by examiner

THREE-DIMENSIONAL ARTICLES USING NONLINEAR THERMAL POLYMERIZATION

CROSS REFERENCE TO RELATED APPLICATIONS

This application is a national stage filing under 35 U.S.C. 371 of PCT/US2009/063954, filed 11 Nov. 2009, which claims priority to Provisional Application No. 61/120,068, filed 5 Dec. 2008, the disclosure of which is incorporated by reference in its/their entirety herein.

FIELD

This disclosure relates to a method for building three-dimensional articles using a thermal polymerization process.

BACKGROUND

Three-dimensional articles can be replicated from a mold by repeatedly filling the mold with a material that can fill in all of the topological features of the mold, can be solidified, and then can be easily removed from the mold. Useful materials can include polymeric thermoplastic and polymeric thermosetting materials. Thermoplastic materials can be introduced into the mold cavity in a heated, flowable state and then can be solidified by cooling. Thermosetting compounds can be introduced into the mold as a liquid precursor and then cured to yield a solid replica. It is known to cure thermosetting compounds by a variety of means known to those of ordinary skill in the art including chemical reaction, thermal polymerization, UV-visible photopolymerization, or exposure to electron beam radiation.

The molds, commonly known as tools, can be produced by machining or they can be produced using alternate technologies discussed below. There is an interest in commercial and industrial applications to reduce the size of replicated articles and devices. A number of technologies have been developed to make molds for microreplication or nanoreplication of parts. These include using two-photon photochemistry to allow the selective solidification of individual volume elements (voxels) of a liquid resin system. Typically the systems employing this technology can make very high-resolution features over a small area. However two-photon photochemistry requires exposure to light sufficient to cause the photoinitiator to absorb at least two photons simultaneously. This requires a very high intensity pulse of radiation over a very short time and specialized equipment to produce these pulses.

SUMMARY

There is a need for methods to allow low cost, rapid production of polymeric structures such as molds or tools. There is a need for a method to make tools that are used for the replication of relatively large articles that have features over a large area (from tens of square micrometers to several square meters). There is also a need for a method of producing polymeric structures that is low cost, rapid, and doesn't require the specialized equipment needed for two photon photochemistry.

In one aspect, a method for making a three-dimensional article is provided that includes providing a composition comprising a plurality of voxels wherein the composition includes; a polymerizable mixture; a thermal polymerization initiator; and a nonlinear light-to-heat conversion material, focusing a laser beam within a first voxel of the composition, and initiating polymerization of the composition within the first voxel, wherein at least a portion of the laser beam is absorbed by the nonlinear light-to-heat conversion material within the first voxel.

In another aspect, a method of making a three-dimensional tool is provided that includes providing a substrate, coating a composition on the substrate to form a coated substrate, the composition of the coated substrate comprising a plurality of voxels, wherein the composition includes a polymerizable mixture; a thermal polymerization initiator; and a nonlinear light-to-heat conversion material, placing a microlens array near the coated substrate; exposing the microlens array to a laser beam to create one or more focused laser beams that expose one or more voxels of the coated substrate; and initiating polymerization of the coated substrate in the one or more exposed voxels, wherein at least a portion of the laser beam is absorbed by the nonlinear light-to-heat conversion material within the one or more voxels of the coated substrate.

In yet another aspect, a polymerizable composition is provided that includes a polymerizable mixture, a thermal polymerization initiator, and a nonlinear light-to-heat conversion material, wherein the polymerizable mixture consists essentially of polymerizable or crosslinkable ethylenically-unsaturated species.

As used herein:

"alkyl" refers to a monovalent group that is a radical of an alkane, which is a saturated hydrocarbon. The alkyl can be linear, branched, cyclic, or combinations thereof and typically has 1 to 20 carbon atoms;

"aryl" refers to a monovalent group that is aromatic and carbocyclic. The aryl can have one to five rings that are connected to or fused to the aromatic ring. The other ring structures can be aromatic, non-aromatic, or combinations thereof;

"coated substrate" refers to a substrate that has at least one layer of material upon it irrespective of the process means that was used to put the at least one layer of material onto the substrate;

"light-to-heat converter" refers to a compound or composition that primarily generate heat upon the absorption of actinic radiation;

"heteroalkyl" refers to an alkyl group that includes a hydrocarbon chain that contains heteroatoms such as N, O, and S that replace one or more carbon atoms in the hydrocarbon chain;

"(meth)acrylate" refers to materials derived from both acrylic acid and methacrylic acid;

"nonlinear" refers to a process in which the absorption of actinic radiation is intensity or fluence dependent;

"simultaneous" means two events that occur within the period of $10^{-14}$ seconds or less;

"solid" refers to a composition that can resist flow enough to hold its form for a long period of time such as days, weeks, and even months;

"thermally activatable composition" refers to a composition that upon the application of heat can undergo a detectable change in physical properties;

"voxel" refers to a volume element within a three-dimensional space;

The provided methods utilize a laser-initiated nonlinear thermal polymerization process that allows for selective polymerization of individual voxels within a precursor resin system. By changing the location of a focused laser beam using provided compositions it is possible to build up an array of solidified, polymeric voxels that are the components of a solid article, such as a mold or tool for replication. The provided methods utilize a low cost laser with an easy-to-control nanosecond pulse duration to write three-dimensional structures.

Additionally the provided methods utilize a nonlinear light-to-heat conversion material which may operate by the absorption of two or more photons before heat is produced but, if there is more than one photon absorbed, the absorptions are non-simultaneous.

The above summary is not intended to describe each disclosed embodiment of every implementation of the present invention. The brief description of the drawing and the detailed description which follows more particularly exemplify illustrative embodiments.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

In one aspect, a method for making a three-dimensional article is provided that includes providing a composition comprising a plurality of voxels wherein the composition includes a polymerizable mixture, a thermal polymerization initiator, and a nonlinear light-to-heat conversion material, focusing a laser beam within a first voxel of the composition, and initiating polymerization of the composition within the first voxel, wherein at least a portion of the laser beam is absorbed by the nonlinear light-to-heat conversion material within the voxel. The composition includes a polymerizable mixture that can be made from monomers, oligomers, or lower molecular weight polymers that can have reactive functionality and can polymerize and/or crosslink to form a solid. Examples of components of the polymerizable mixture include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and mixtures thereof.

Suitable ethylenically-unsaturated species are described, for example, by Palazzotto et al. in U.S. Pat. No. 5,545,676, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexaacrylate, bis[1-(2-acryloxy)]-p-ethoxyphenyldimethylmethane, bis[1-(3-acryloxy-2-hydroxy)]-p-propoxyphenyldimethylmethane, tris-hydroxyethyl-isocyanurate trimethacrylate, the bis-acrylates and bis-methacrylates of polyethylene glycols of molecular weight about 200-500, copolymerizable mixtures of acrylated monomers such as those of U.S. Pat. No. 4,652,274 (Boettcher et al.), and acrylated oligomers such as those of U.S. Pat. No. 4,642,126 (Zador et al.)); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as SARBOX resins available from Sartomer (for example, SARBOX 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used, if desired. In some embodiments, ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (typically, at least about 1.5 or at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative permissible substituent groups include halogens, ester groups, ethers, sulfonate groups, siloxane groups, hydroxyl groups, nitro groups, and phosphate groups. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099 (Proops et al.).

Other epoxy-containing materials that are useful include glycidyl ether monomers of the formula where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262 (Schroeder), and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations EPON 828, EPON 825, EPON 1004, and EPON 1010 from Resolution Performance Products, formerly Shell Chemical Co., Houston, Tex., as well as DER-331, DER-332, and DER-334 from Dow Chemical Co., Midland, Mich.), vinylcyclohexene dioxide (for example, ERL-4206 from Dow Chemical Corp.), 3,4-epoxycyclohexylmethyl-3,4-epoxycyclohexene carboxylate (for example, ERL-4221 or CYRACURE UVR 6110 or UVR 6105 from Dow Chemical Corp.), 3,4-epoxy-6-methylcyclohexylmethyl-3,4-epoxy-6-methyl-cyclohexene carboxylate (for example, ERL-4201 from Dow Chemical Corp.), bis(3,4-epoxy-6-methylcyclohexylmethyl) adipate (for example, ERL-4289 from Dow Chemical Corp.), bis(2,3-epoxycyclopentyl) ether (for example, ERL-0400 from Dow Chemical Corp.), aliphatic epoxy modified from polypropylene glycol (for example, ERL-4050 and ERL-4052 from Dow Chemical Corp.), dipentene dioxide (for example, ERL-4269 from Dow Chemical Corp.), epoxidized polybutadiene (for example, OXIRON 2001 from FMC Corp., Philadelphia, Pa.), silicone resin containing epoxy functionality, flame retardant epoxy resins (for example, DER-580, a brominated bisphenol type epoxy resin available from Dow Chemical Co.), 1,4-butanediol diglycidyl ether of phenolformaldehyde novolak (for example, DEN-431 and DEN-438 from Dow Chemical Co.), resorcinol diglycidyl ether (for example, KOPDXITE from Koppers Company, Inc.), bis(3,4-epoxycyclohexyl)adipate (for example, ERL-4299 or UVR-6128, from Dow Chemical Corp.), 2-(3,4-epoxycyclohexyl-5,5-spiro-3,4-epoxy)cyclohexane-meta-dioxane (for example, ERL-4234 from Dow Chemical Corp.), vinylcyclohexene monoxide 1,2-epoxyhexadecane (for example, UVR-6216 from Dow Chemical Corp.), alkyl glycidyl ethers such as alkyl $C_8$-$C_{10}$ glycidyl ether (for example, HELOXY Modifier 7 from Hexion Specialty Chemicals, Houston, Tex.), alkyl $C_{12}$-$C_{14}$ glycidyl ether (for example, HELOXY Modifier 8), butyl glycidyl ether (for example, HELOXY Modifier 61), cresyl glycidyl ether (for example, HELOXY Modifier 62), p-tert-butylphenyl glycidyl ether (for example, HELOXY Modifier 65), polyfunctional glycidyl ethers such as diglycidyl ether of 1,4-butanediol (for example, HELOXY Modifier 67), diglycidyl ether of neopentyl glycol (for example, HELOXY Modifier 68), diglycidyl ether of cyclohexanedimethanol (for example, HELOXY Modifier 107), trimethylol ethane triglycidyl ether (for example, HELOXY Modifier 44), trimethylol propane triglycidyl ether (for example, HELOXY Modifier 48 from), polyglycidyl ether of an aliphatic polyol (for example, HELOXY Modifier 84), polyglycol diepoxide (for example, HELOXY Modifier 32), bisphenol F epoxides (for example, EPON-1138 or GY-281 from Ciba Corp., Tarrytown, N.Y.), and 9,9-bis[4-(2,3-epoxypropoxy)-phenyl]fluorenone (for example, EPON 1079, available from Hexion).

Other useful epoxy resins comprise copolymers of acrylic acid esters of glycidol (such as glycidyl acrylate and glycidyl methacrylate) with one or more copolymerizable vinyl compounds. Examples of such copolymers are 1:1 styrene-glycidyl methacrylate, 1:1 methylmethacrylate-glycidyl acrylate, and a 62.5:24:13.5 methylmethacrylate-ethyl acrylate-glycidyl methacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg et al.), available from the General Electric Company, Schenectady, N.Y. These are polydimethylsiloxanes in which 1-20 mole % of the silicon atoms have been substituted with epoxyalkyl groups (typically, epoxy cyclohexylethyl, as described in U.S. Pat. No. 5,753,346 (Leir et al.)).

Blends of various epoxy-containing materials can also be utilized. Such blends can comprise two or more weight average molecular weight distributions of epoxy-containing compounds (such as low molecular weight (below 200 Daltons (Da)), intermediate molecular weight (about 200 Da to 10,000 Da), and higher molecular weight (above about 10,000 Da)). Alternatively or additionally, the epoxy resin can contain a blend of epoxy-containing materials having different chemical natures (such as aliphatic and aromatic) or functionalities (such as polar and non-polar). Other cationically-reactive materials (such as vinyl ethers and oxetanes) can additionally be incorporated, if desired.

In some embodiments, epoxies include aromatic glycidyl epoxies (such as the EPON resins available from Hexion Specialty Chemicals, Columbus, Ohio) and cycloaliphatic epoxies (such as ERL-4221 and ERL-4299 available from Dow Chemical).

Suitable cationically-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (RAPI-CURE DVE-3, available from International Specialty Products, Wayne, N.J.), trimethylolpropane trivinyl ether (TMPTVE, available from BASF Corp., Mount Olive, N.J.), and the VECTOMER divinyl ether resins from Morflex, Greensboro, N.C. (for example, VECTOMER 2010, VECTOMER 2020, VECTOMER 4010, and VECTOMER 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373

(Kaisaki et al.)) can also be utilized in combination with epoxy- and/or vinyl ether-functional materials.

Other ingredients which may be incorporated in the composition include monohydroxy and polyhydroxy compounds, thixotropic agents, plasticizers, toughening agents, pigments, fillers, abrasive granules, stabilizers, light stabilizers, antioxidants, flow agents, bodying agents, flatting agents, colorants, binders, blowing agents, fungicides, bactericides, surfactants, glass and ceramic beads, and reinforcing materials such as woven and non-woven webs of organic and inorganic fibers.

In some embodiments, the thermal polymerization initiator can be a thermal free radical initiator. Examples of useful thermal initiators include but are not limited to those selected from the group consisting of azo compounds such as 2,2-azo-bisisobutyronitrile, dimethyl 2,2'-azobis-isobutyrate, azo-bis-(diphenyl methane), 4-4'-azobis-(4-cyanopentanoic acid); peroxides such as benzoyl peroxide, cumyl peroxide, tert-butyl peroxide, cyclohexanone peroxide, glutaric acid peroxide, lauroyl peroxide, hydrogen peroxide, hydroperoxides such as tert-butyl hydroperoxide and cumene hydroperoxide, peracids such as peracetic acid and perbenzoic acid, potassium persulfate, and peresters such as diisopropyl percarbonate.

In other embodiments, the thermal polymerization initiator can include a thermal cationic initiator. Useful thermal cationic initiators in include benzylpyridinium or ammonium salts of a non-nucleophilic anion such as, for example, hexafluorophosphate, tetrafluoroborate, hexafluoroantimonate, tris(trifluoromethylsulfonyl) methide, or hexafluoroarsenate anion. Other useful non-nucleophilic anions include benzenesulfonate anions of benzylpyridinium or benzylammonium salts. These heat-latent cationic polymerization catalysts are described, for example, in U.S. Pat. Nos. 5,066, 722 and 5,070,161 (both Nakano et al.). Additional useful thermal cationic initiators include, for example, benzylanilinium and p-substituted benzylanilinium salts of non-nucleophilic anions, such as $SbF_6^-$, as described by S. Nakano and T. Endo in *Progress in Organic Coatings*, 22, 287-300 (1993), and *Journal of Polymer Science: Part A: Polymer Chemistry*, Vol. 33, 505-512 (1995). Other useful polymerization initiator components include accelerators for cationic polymerization catalyzed by organometallic salts, for example, iron-based salts such as those described in U.S. Pat. Nos. 6,635,689 and 6,906,156 (Mahoney et al.).

It is contemplated that more than one thermal polymerization initiator can be utilized in the provided compositions and methods. For example, the provided compositions and methods can include more than one thermal radical initiator, more than one thermal cationic initiator, or a combination of one or more radical and/or cationic initiators.

The provided compositions include a nonlinear light-to-heat conversion material. The nonlinear light-to-heat conversion materials may be reverse saturable absorption (RSA) materials such as reverse saturable dyes. For a linear light absorber, the light absorption through a medium follows Beer's Law as shown in equations 1 and 2 below:

$$I(z) = I_0 e^{-\alpha z} \tag{1}$$

or $$\frac{dI}{dz} = -\alpha I \tag{2}$$

where $I(z)$ is the intensity of the light at the medium penetration depth z, $I_0$ is the light intensity before it is attenuated by the medium, and $\alpha$ is the absorption coefficient and I is the light intensity. For a linear light absorber, the absorption coefficient is a constant, independent of the light intensity or fluence. Nonlinear absorption on the other hand means that the absorption coefficient depends on the light intensity or fluence. This can lead to both increased transmittance with increasing light intensity or decreased transmittance with increasing light intensity.

For reverse saturable absorption materials, the absorption process is also sometimes referred to as excited state absorption, and is characterized by the absorption cross section for the excited state involved in the absorption process being much larger than the cross section for excitation from the ground state to the excited state. The total light absorption involves both ground state absorption (the linear term) and excited state absorption. The equation describing the light intensity (I) as a function of depth of the material (z) is therefore given by equation (3):

$$\frac{dI}{dz} = -(\alpha_0 + \sigma N)I \tag{3}$$

where $\sigma$ is the absorption cross-section for transitions from the excited state. The population density of the excited state N, is produced by ground state absorption (linear absorption) with absorption coefficient $\alpha_0$ and is given by equation (4) below:

$$dN/dt = \alpha_0 I/\hbar\omega \tag{4}$$

where $\hbar\omega$ is the incident photon energy. Integration of equation (4) with respect to time, substitution into equation (3), and integration with respect to time again results in equation (5) below:

$$\frac{dF}{dz} = -\left[\alpha_0 + \frac{\alpha_0 \sigma}{2\hbar\omega}F\right]F \tag{5}$$

These equations show that the dependence of the energy density or fluence (F), of the light in the material depends on the square of the fluence and, thus, is nonlinear.

Examples of reverse saturable absorption dyes that function as non-linear light-to-heat converter compositions include metallophthalocyanines, naphthalocyanines, cyanines, fullerenes, metal nanoparticles, metal oxide nanoparticles, metal cluster compounds, porphyrins, indanthrone derivatives and oligomers or combinations thereof. Examples of metallophthalocyanines include copper phthalocyanine (CuPc), and phthalocyanines containing metal or metalloids from group IIIA (Al, Ga, In) and IVA (Si, Ge, Sn, Pb). Examples of naphthalocyanines include, for example, the phthalocyanine derivatives of silicon (SiNC), tin (SnNC), and lead (PbNC). An example of a cyanines includes 1,3,3,1',3', 3'-hexamethylindotricarbocyanine iodide (HITCI). Examples of fullerenes include C60 and C70 fullerenes. Examples of metal nanoparticles include gold, silver, platinum, aluminum, and zinc nanoparticles. Examples of metal oxide nanoparticles include titanium dioxide, antimony tin oxide, and zirconium dioxide nanoparticles. Examples of metal clusters include iron tricobalt metal clusters such as $HFeCo_3(CO)_{12}$ and $NEt_4FeCO_3(CO)_{12}$. Examples of porphyrins include tetraphenylporphyrin (H2TPP), zinc tetraphenylporphyrin (ZnTPP), and cobalt tetraphenylporphyrin (CoTPP). Examples of indanthrone derivatives include unsubstituted indanthrone, oxidized indanthrone, chloroindanthrone, and an indanthrone oligomer. In some embodiments the non-linear light-to-heat converter composition comprises copper phthalocyanine, tin phthalocyanine, or a combination thereof.

The non-linear light-to-heat converter composition generally may be present in fairly small quantities. Typically the non-linear light absorber is present in the amount of from about 0.05 weight % (wt %) to about 5 wt % or even from about 0.1 wt % to about 3 wt %.

The provided method is directed towards making a three-dimensional article. The article can be an end use article or can be a mold that can be useful for producing replicates. The method includes providing a composition as described above that comprises voxels. The composition includes a polymerizable mixture, a polymerization initiator, and a nonlinear light-to-heat conversion material. The method further includes focusing a laser beam within a first voxel of the composition. Particularly useful are lasers that are combined with focusing optics to focus the laser output to a specific location within the composition. In some embodiments, the laser pulse duration is from 100 picoseconds to 1 microsecond.

Many lasers emit beams with a Gaussian profile, in which case the laser is said to be operating on the fundamental transverse mode, or "$TEM_{00}$ mode" of the laser's optical resonator. The Gaussian beam is a beam of electromagnetic radiation whose transverse electric field and intensity (irradiance) distributions are described by Gaussian functions. For a Gaussian beam, the spot size w(z) is defined as the radius of the circle around the z axis when the intensity at the circle is $1/e^2$ to that of the center of the circle. When an incident laser beam is focused by a lens, the propagated laser beam spot size w(z) will be at a minimum value $w_0$ at one place along the beam propagation axis z, known as the beam waist. For a beam of wavelength λ at a distance z along the beam from the beam waist, the variation of the spot size is given by equation (6):

$$w(z) = w_0 \sqrt{1 + \left(\frac{z}{z_0}\right)^2} \quad (6)$$

where the origin of the z-axis is defined, without loss of generality, to coincide with the beam waist, and where $z_0$ is called the Rayleigh range and is defined by equation (7):

$$z_0 = \frac{\pi w_0^2}{\lambda} \quad (7)$$

At a distance from the beam waist equal to the Rayleigh range $z_0$, the width, w, of the beam is defined by equation (8):

$$w(\pm z_0) w_0 \sqrt{2} \quad (8)$$

The distance between these two points (+$z_0$ and −$z_0$) is called the confocal parameter, b, or the depth of focus of the beam, and is 2 times the Rayleigh range $z_0$.

Another way to describe the laser focus is by the numerical aperture (usually abbreviated NA), which is the refractive index of the lens material, n, times the sine of the half angle of the cone of the focus Θ as shown in equation (9) below:

$$NA = n * \sin\frac{\Theta}{2} \approx \frac{D}{2f} \quad (9)$$

where f is the focal length of the focusing lens and D is the diameter of the lens or the diameter of the laser beam coming into the lens. The spot size of the focused beam is determined by the numerical aperture defined in equation (9). If the beam incident on the lens has a constant transverse profile, i.e., a flat top beam, the focused spot has an intensity profile described by the Airy disc where the diameter (2$w_o$) of the first dark ring is given by equation (10) below:

$$2w_0 = 1.22 \frac{\lambda}{N} \quad (10)$$

where λ is the laser wavelength. The focused spot size is inversely related to the NA. A comparison of equations (7) and (10), demonstrates that the depth of focus of the beam is directly related to the laser wavelength and inversely related to the square of NA.

Useful lasers include lasers that can excite the nonlinear light-to-heat conversion materials. Generally these materials absorb in the visible to near infrared region of the spectrum. Useful lasers include continuous lasers with a shutter and pulsed lasers. The lasers can be gas lasers or solid state lasers and can include laser diodes. Useful lasers include, for example, Q-switched Nd:YAG lasers, visible wavelength dye lasers, and Q-switched diode pumped lasers.

In the provided method, the laser beam is focused along the z axis, with the beam waist located at the approximate location of a voxel. Whereas linear absorption processes vary linearly with the light intensity or fluence, the nonlinear absorption processes characteristic of the materials used in this disclosure vary as the intensity or fluence raised to some higher power (such as a quadratic dependence). With a linear absorption process, it is generally not possible to independently activate individual voxels, even by focusing the laser beam waist in the middle of the desired voxel with a high numeric aperture lens (NA≥0.3). This is due to the resulting depth of focus of the beam being comparable to or greater than typical voxel dimensions. However, when the laser beam waist is located in a voxel for a nonlinear absorption process, the composition within that voxel can be activated without significant activation of other voxels. This is the result of the effective distance along the z-axis for activation of the nonlinear absorption process being less than the depth of focus of the laser beam. The laser beam intensity or fluence rapidly becomes too low to activate the nonlinear light-to-heat conversion process in adjacent thermally activatable voxels.

The laser beam can be focused so that it exposes the composition within a first voxel. The physics of the focusing is described above. An exemplary focusing system uses an optical fiber coupled to the laser output to deliver the beam to a collimating lens. Typically the collimating lens can have a focal length of about 150 mm. The collimated beam can then be focused on a voxel using, for example, a focusing lens of 30 mm. With this exemplary setup and using the output from a Nd:YAG laser, a focused spot of less than about 200 μm can be obtained. With other setups it is possible to obtain a focused spot of less than about 100 μm, less than about 10 μm, or even less than about 5 μm. A portion of the output from the laser can be absorbed by the nonlinear light-to-heat conversion material and may produce enough heat to activate the included thermal polymerization initiator and subsequently initiate polymerization of the composition within the first voxel.

The provided method further includes changing the location of the focused laser beam to expose a second voxel. The second voxel can be adjacent to the first voxel. In this context, "adjacent" means the first voxel is directly next to or in contact with the second voxel. The laser beam can then initiate thermal polymerization of the composition within the second voxel. By continuing to change the location of the focused laser beam into additional adjacent voxels, it is possible to create a three-dimensional solid or semi-solid article consisting of the polymerized voxels. The exposed and polymerized voxels can be developed by washing the composition (including polymerized and unpolymerized volumes) with a solvent that dissolves the unpolymerized composition but not the polymerized composition. An optional bake after exposure of a series of voxels to the laser beam, but prior to solvent development, can be useful for some compositions such as, for example, epoxy-type reactive species. Typical bake conditions include temperatures in a range of from about 40° C. to about 200° C., for times in a range of from about 0.5 minutes to about 20 minutes.

Optionally, after exposure to polymerize the structured areas, typically followed by solvent development, a non-imagewise exposure using actinic radiation can be carried out to affect reaction of the remaining unreacted photoreactive composition. Such a non-imagewise exposure can typically be carried out by using a one-photon process, but only works if a photoinitiator is present in the composition in addition to the thermal initiator.

In some embodiments, the article can be a mold or tool that can be used to make inverse replicas of the mold. It is to be understood that "inverse replicas" refer to a three-dimensional negative of the mold or an article case from the mold. In other embodiments the article can be used to directly make a mold which can then further be used to make replicas of the original article. When used as a mold or tool, the articles of the provided methods and compositions can be inversely replicated by, for example, casting a flowable polymer in the cavity of the mold and then solidifying the polymer to form a replica of the mold. Alternatively, if a desired finished article is produced by the provided methods or compositions then an inverse replica or mold can be made of the article by making a mold of the article using a flowable polymer.

Polymers useful for forming the replica can include thermoplastic polymers and thermosetting polymers known to those skilled in the art. Thermoplastic polymers can include materials that soften or melt above room temperature but that are rigid and can hold structure when at or below room temperature. Some thermoplastic polymers that can be useful to produce replicas include, for example, polymethylmethacrylate (PMMA), polycarbonate (PC), polystyrene (PS), polyvinylchloride (PVC), polypropylene (PP), polyethylene terephthalate (PET), polyetheretherketone (PEEK), polyamide (PA), polysulfone (PSU), polyvinylidenefluoride (PVDF), and polyoxymethylene (POM).

Thermosetting polymers can also be useful for forming replicas. Thermosetting polymers that are useful include polysiloxanes (such as polydimethyldisiloxane (PDMS)), polyimides (made from curing of polyamic acid), and urethane acrylates. For the replication of nanofeatures and microstructures, the polymers used to form the replica can have low viscosity. This can allow the polymer to flow into and around the small features of the article. It can be useful to apply the polymer to the article under vacuum so that air entrapment between the article and the polymer is minimized.

It can be advantageous to apply a release coating to the mold before forming a replica. If the hierarchical article is made from $SiO_2$, SiN, or other inorganic or polymeric materials, the article can be coated with a fluorosilane release agent such as, for example, trimethylchlorosilane or fluorinated siloxanes such as those disclosed in U.S. Pat. No. 5,851,674 (Pellerite et al.). Also useful for this purpose are hexafluoropolypropylene oxide derivatives such as those disclosed in U.S. Pat. No. 7,173,778 (Jing et al.).

Alternatively, the article can be metalized with, for example, a thin layer of nickel that has been vapor deposited or deposited by electroless plating. If the article is metalized it can also be advantageous to put a release agent on the metalized article to enhance the release of the polymers that form the replica. For example, the article can be coated with a release layer such as a fluorinated phosphonic acid as disclosed in U.S. Pat. No. 6,824,882 (Boardman et al.) or perfluoropolyether amide-linked phosphonates such as those disclosed in U.S. Pat. Publ. No. 2005/0048288 (Flynn et al.). It is also contemplated that the hierarchical article can be protected by coating with diamond-like glass as disclosed, for example in U.S. Pat. No. 6,696,157 (David et al.).

The replica-forming polymers can be placed in contact with the mold (with or without a protective coating), cured by any of a variety of means including heat, moisture or radiation, and then separated from the article to produce a negative relief image (replica) of the article. The replicas can be used to produce secondary or daughter molds of the original article.

In another aspect, a method of making a three-dimensional article is provided that includes providing a substrate, coating a composition on the substrate to form a coated substrate, the composition of the coated substrate comprising a plurality of voxels. In some embodiments the possible substrates can include glass, metal, polymers, paper, and composites. In some embodiments the substrate can include a silicon wafer or an electronic circuit board. The composition may be the same as described above. The method further includes placing a microlens array near the coated composition, exposing the microlens array to a laser beam to create one or more focused laser beams that expose one or more voxels within the composition, and initiating polymerization of the composition in the one or more exposed voxels. At least a portion of the laser beam is absorbed by the nonlinear light-to-heat conversion material within the one or more voxels of the coated substrate.

Figure 1:
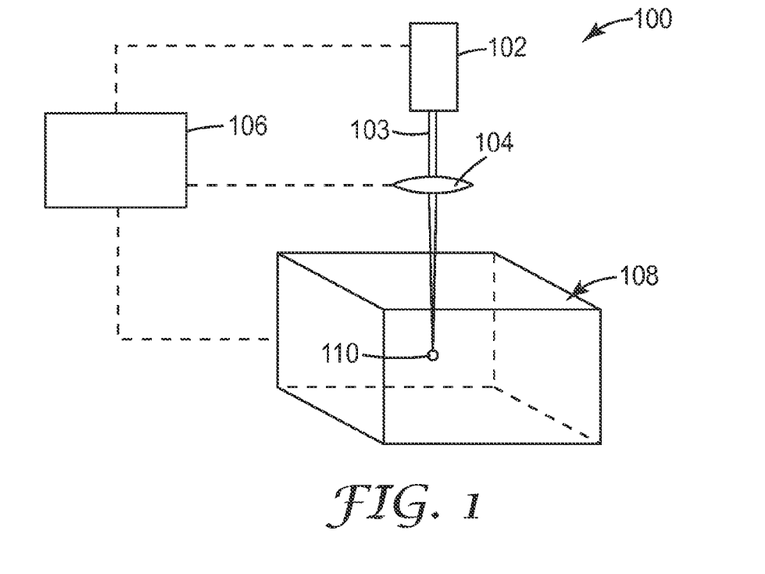
FIG. 1 schematically illustrates one methodology for producing three-dimensional articles.
Figure 2:
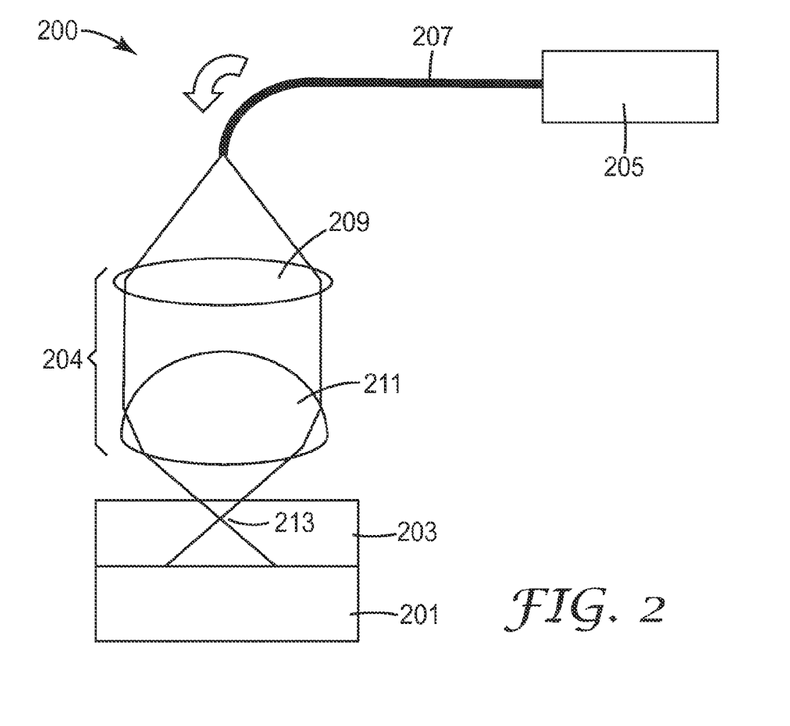
FIG. 2 schematically illustrates an embodiment of an exposure system including an optical lens system useful in the provided method.

FIGS. 1 and 2 schematically illustrate one embodiment of the provided method and composition in more detail. Referring to FIG. 1, system 100 includes laser light source 102 that directs laser beam 103 through optical lens system 104. Optical lens system 104 is further illustrated in FIG. 2. Lens system 104 focuses laser light 103 within focal region (voxel) 110 within body 108 that includes a composition that comprises a polymerizable mixture, a thermal polymerization initiator, and a nonlinear light-to-heat conversion material. Laser light 103 has an intensity, and the light-to-heat conversion material has an absorption such that the light intensity outside of focal region 110 is insufficient to produce enough heat to initiate polymerization of the composition outside of the focal region, whereas the light intensity in the portion of the composition inside of focal region 110 is sufficient to cause absorption of enough laser light 103 to produce enough heat to activate the thermal polymerization initiator within focal region 110. In practical terms, this means that the voxel of composition 110, within the focal region, will solidify or harden via thermal curing, while portions of the composition outside of focal region 110 are substantially unaffected. A suitable translation mechanism, represented by 106 provides relative movement between body 108, optical lens system 104 and/or focal region 110 in three dimensions to allow the focal region to be positioned at any desired location within body 108. This relative movement can occur by physical movement of light source 102, optical lens system 104, and/or body 108, and may form one or more three-dimensional structures within body 108. One suitable translation system can include a mirror-mounted galvanometer with a moving (translation) stage.

Details of an embodiment of a useful exposure system 200 including optical lens system 204 are shown schematically in FIG. 2. Light from laser source 205 is transmitted along optical fiber 207. At the end of the optical fiber the transmitted laser beam diverges from the fiber. Most of the laser beam is captured by optical lens system 204 which consists of a collimating lens 209 which collimates the laser beam, and focal lens 211 which focuses the laser beam on a voxel 213 within the polymerizable composition 203 which is on top of translation stage 201. The translation stage can be moved in six directions (x, y, and z) to relocate focal point 213 on a different voxel.

Figure 3:
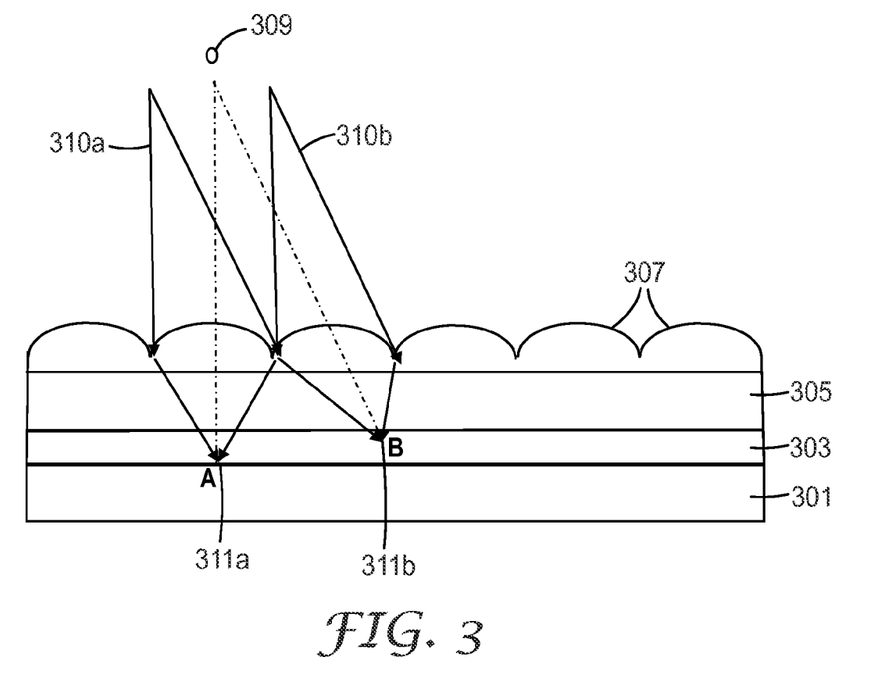
FIG. 3 is a schematic of an embodiment of the provided method that includes a microlens array.

FIG. 3 is a schematic of an embodiment of the provided method that includes a microlens array. Provided polymerizable composition 303 is adjacent to and in contact with silicon wafer 301. A microlens array film is in contact with the other side of polymerizable composition 303. The microlens array film consists of substrate 305 which is in contact with the polymerizable composition and a microlens array 307 in contact with substrate 305. A laser source coming from point 309 illuminates multiple microlenses. In the illustrative example, a laser beam coming from point 309 illuminates the two microlenses in array 307 that are within divergence cones 310a and 310b for each individual lens respectively. The light is focused on spots A (311a) and B (311b) which are different voxels within composition 303. In this embodiment more than one focused spot illuminating more than one voxel at a time can result from one laser beam using a microlens array.

Objects and advantages of this invention are further illustrated by the following examples, but the particular materials and amounts thereof recited in these examples, as well as other conditions and details, should not be construed to unduly limit this invention.

EXAMPLES

All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted.

Example 1

To a 1 liter three-necked flask was added 56.4 g of PC 1733 (a polycarbonate diol, molecular weight 998, available from Stahl USA Inc., Peabody, Mass.), 19.7 g of neopentyl glycol, 86.2 g AGEFLEX FA12 (lauryl acrylate (LA), available from CIBA Specialty Chemicals, Basel, Switzerland), 82.5 g isobornyl acrylate (IBA, available from Sartomer Co, Warrington, Pa.), and 0.03 g IRGANOX 1010 (available from CIBA Specialty Chemicals). The mixture was stirred and heated to 50° C. to dissolve all components. After dissolution, 55.2 g isophorone diisocyanate and 0.01 g dibutyltin dilaurate were added. The reaction was heated to 80° C. under air atmosphere and held at that temperature for 18 hours. Infrared spectroscopy showed no residual isocyanate. 75.0 g of hydroxypropyl acrylate (HPA, available from Dow Chemical Co., Midland, Mich.) was added and the mixture was cooled to room temperature.

Part of the above sample (40 g) was mixed with SR 213 (butanediol diacrylate, 10 g), Luperox 575 (1.0 g), and a 1% copper phthalocyanine solution in toluene (2.0 g). This sample, which was blue, was coated on a wafer with a thickness measured to be 10 microns.

A diode pumped Nd:YAG laser (commercially available from IB Laser Berlin, Germany) at the second harmonic wavelength (532 nanometers), with pulse duration of 10 nanoseconds, and a pulse repetition rate of 1,000 Hz was used to activate the thermal polymerization. The single pulse energy was measured around 2 millijoules per pulse. The output of the laser was coupled to an optical fiber, collimated by a lens with a focal length of 150 millimeters and focused on the sample by a lens with a focal length of 30 millimeters. This assembly was held by a robot arm with the laser focal spot at a distance of 6 millimeters away from the sample (FIG. 2).

For each example, a solution according to the formulations disclosed in the Examples, was coated on a silicon wafer using spin coating. The layer thickness was measured around 10 microns. A microlens array film was place on top of the sample (FIG. 2). The microlens had a pitch of around 100 microns. The microlens' focal spot was designed 10 microns beneath the film. The film was pushed by a roller to get rid of air bubbles. The system schematically illustrated in FIG. 3 was used to write images (parallel linear ridges) by move the point "o" vertically and laterally. After the laser writing the lens array film was pulled of and isoproponol was used to wash out the monomers. The polymerized structure was kept on the wafer surface. Microscope imaging showed the structure of three-dimensional ridges that were written. The resolution of the structure was found to be better than 2 microns. This experiment shows that the thermal initiate polymerization works in building a three-dimensional structure.

Comparative Example 1

The same recipe of composition as Example 1 was used in Comparative Example 1, except that the copper phthalocyanine was left out. After the laser writing, the lens array film was peeled of and solvent was used to wash out the monomers. No structure was observed to be written on the wafer.

Example 2

Nonlinearity of Polymerization Process

The following solutions were prepared
Solution A:
  30% polymethyl methacrylate, 120,000 MW (Aldrich, Milwaukee, Wis.),
  35% SR9008 trifunctional acrylate (Sartomer, Exton, Pa.)
  35% SR368 trifunctional acrylate (Sartomer) was prepared as a
  55% solids of the above composition in a solution that has 45% cyclopentanone.
Solution B:
  20 gram of solution A
  0.11 g benzoyl peroxide
  1.892 g of a 0.5 wt % copper phthalocyanine dispersion
  4.44 g of cyclopentanone
  The solution B was stirred until homogeneous, then filtered through a 0.2 micron syringe filter. A six inch silicon wafer was surface treated with trimethoxysilylpropyl methacrylate in ethanol and dried in an oven at 105 C. Solution B was coated on the treated silicon wafer by spin coating resulting in a 10 μm film.

A diode pumped Nd:YAG laser (commercially available from IB Laser Berlin, Germany) at the second harmonic wavelength (532 nanometers), with pulse duration of 10 nanoseconds, and a pulse repetition rate of 1,000 Hz was used. The output of the laser was coupled to an optical fiber, collimated by a lens with a focal length of 150 millimeters and focused on the sample by a lens with a focal length of 30 millimeters. The focus spot was measured around 200 microns. Parallel ridge exposures (three-dimensional lines) were made at laser power (average power) of 530, 371, 267, 177 mW respectively, and at each laser power level, at various line speeds from 0.25 to 6.75 mm/second. After developing the samples, the polymerized images were visually analyzed. The ridge written at 177 mW and 0.25 mm/sec is comparable in width, depth, and resolution to the line written at 267 mW and 2.25 mm/sec, or 371 mW and 6.75 mm/sec. The nonlinearity of the correlation between laser power and line speed demonstrates that the nonlinearity of the polymerization process.

Example 3

Thermally Induced Polymerization

The following solutions were prepared:
Solution A:
  30% polymethyl methacrylate, 120,000 MW (Aldrich),
  35% SR9008 trifunctional acrylate (Sartomer)
  35% SR368 trifunctional acrylate (Sartomer) was prepared as a
  55% solids of above composition in a solution with 45% cyclopentanone.
Solution B:
  20 gram of solution A
  CD1012 (Diaryl Iodonium hexafluoroantimonate) (Sartomer)
  1.892 g of a 0.5% copper phthalocyanine dispersion
  4.44 g of cyclopentanone
The solution B was stirred until homogeneous, then filtered through a 0.2 micron syringe filter. A six inch silicon wafer was surface treated with trimethoxysilylpropyl methacrylate in ethanol and dried in an oven at 105 C. Solution B was coated on the treated silicon wafer by spin coating resulting in a 10 μm film.

A diode pumped Nd:YAG laser (available from Edgewave Laser, Germany) at the second harmonic wavelength (532 nanometers), with pulse duration of 10 nanoseconds, and a pulse repetition rate of 10,000 Hz was used. The output of the laser beam diameter was around 5 mm. The beam was then focused on the sample by a lens with a focal length of 30 millimeters. The focus spot was measured around 5 microns. In this experiment, it is hypothesized that CD1012 releases radicals when heated and induces polymerization. Parallel ridge exposures (three-dimensional lines) were made at laser power (average power) of 2.5 mW, 3.5 mW, and 5 mW respectively, and at each laser power level, the speed of the exposure was varied from 1.5 to 24 mm/second. After developing the sample, the polymerized images were counted. At 5 mW laser output and 24 mm/sec speed, the polymerized pattern was comparable to that made using a laser power of 3.5 mW and a speed of 3 mm/sec. The polymerization patterns were observed to have better depth and width resolution for the sample exposed at 2.5 mW and 1.5 mm/sec. This experiment demonstrates the nonlinearity of the provided methodology.

Example 4

Thermally Induced Polymerization with More than One Thermal Initiator

The following solutions were made:
Solution A:
  30% polymethyl methacrylate, 120,000 MW (Aldrich),
  35% SR9008 trifunctional acrylate (Sartomer)
  35% SR368 trifunctional acrylate (Sartomer) was prepared as a
  55% of above composition solids in a solution with 45% cyclopentanone.
Solution B:
  20 gram of solution A
  0.11 g CD1012 (Diaryl Iodonium hexafluoroantimonate) (Sartomer)
  0.11 g benzoylperoxide
  1.892 g of a 0.5% copper phthalocyanine dispersion
  4.44 g of cyclopentanone
Solution B was stirred until homogeneous, then filtered through a 0.2 micron syringe filter. A six inch silicon wafer was surface treated with trimethoxysilylpropyl methacrylate in ethanol and dried in an oven at 105° C. Solution B was coated on the treated silicon wafer by spin coating resulting in a 10 μm film.

A diode pumped Nd:YAG laser (commercially available from IB Laser Berlin, Germany) at the second harmonic wavelength (532 nanometers), with pulse duration of 10 nanoseconds, and a pulse repetition rate of 1,000 Hz was used. The output of the laser was coupled to an optical fiber, collimated by a lens with a focal length of 150 millimeters and focused on the sample by a lens with a focal length of 30 millimeters. The focus spot was measured around 200 microns. Parallel ridge exposures (three-dimensional lines) were made using a laser power (average power) of 530, 371, 267, and 177 mW respectively, and at each laser power level, at various line speed was varied from 0.25 to 6.75 mm/second. After developing the sample, the polymerized images were visually analyzed. It was found that a ridge written at 177 mW and 0.25 mm/sec had comparable resolution to a ridge written at 267 mW and 2.25 mm/sec, or 371 mW and 6.75 mm/sec. In this example, a thermal initiator, benzoyl peroxide, was added to the CD1012 to trigger the thermal polymerization.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited are herein incorporated by reference in their entirety.

What is claimed is:

1. A method for making a three-dimensional article comprising:
  providing a composition comprising a plurality of voxels wherein the composition further comprises;
    a polymerizable mixture;
    a thermal polymerization initiator; and
    a nonlinear light-to-heat conversion material, wherein the nonlinear light-to-heat conversion material is selected from fullerenes, metal nanoparticles, metal oxide nanoparticles, and combinations thereof;

focusing a laser beam within a first voxel of the composition; and initiating polymerization of the composition within the first voxel, wherein at least a portion of the laser beam is absorbed by the nonlinear light-to-heat conversion material within the first voxel.

2. A method according to claim 1 wherein the polymerizable mixture comprises (meth)acrylate monomers, epoxy monomers, or combinations thereof.

3. A method according to claim 2 wherein the polymerization initiator comprises a peroxide, an azo compound, or a combination thereof.

4. A method according to claim 1 wherein the polymerization initiator comprises a cation-producing material.

5. A method according to claim 1 further comprising changing the location of the focused laser beam to expose a second voxel.

6. A method according to claim 5 wherein the location of the second voxel is adjacent to the first voxel.

7. An inverse replica made from a three-dimensional article made according to the method of claim 1.

8. A method of making a three-dimensional article comprising:

providing a substrate;

coating a composition on the substrate to form a coated substrate, the composition of the coated substrate comprising a plurality of voxels, wherein the composition includes:

a polymerizable mixture;

a thermal polymerization initiator; and a nonlinear light-to-heat conversion material, wherein the nonlinear light-to-heat conversion material is selected from fullerenes, metal nanoparticles, metal oxide nanoparticles, and combinations thereof;

placing a microlens array near the coated substrate;

exposing the microlens array to a laser beam to create one or more focused laser beams that expose one or more voxels of the coated substrate; and initiating polymerization of the coated substrate in the one or more exposed voxels, wherein at least a portion of the laser beam is absorbed by the nonlinear light-to-heat conversion material within the one or more voxels of the coated substrate.

9. The method according to claim 8 further comprising changing the location of the one or more focused laser beams to expose a different set of voxels inside of the composition.

10. A polymerizable composition comprising:

a polymerizable mixture;

a thermal polymerization initiator; and a nonlinear light-to-heat conversion material, wherein the polymerizable mixture consists essentially of polymerizable or crosslinkable ethylenically-unsaturated species, wherein the nonlinear light-to-heat conversion material is selected from fullerenes, metal nanoparticles, metal oxide nanoparticles, and combinations thereof.

11. The composition according to claim 10 wherein the ethylenically-unsaturated species are selected from mono-, di-, and poly-acrylates and methacrylates, unsaturated amides, vinyl compounds, and mixtures thereof.

12. The composition according to claim 11 wherein the ethylenically-unsaturated species comprises acrylate monomers.

13. The composition according to claim 10 wherein the initiator comprises a peroxide, an azo compound, or a combination thereof.

14. The composition according to claim 13 wherein the initiator has a decomposition temperature of less than about 100° C.

* * * * *